US012572079B2

(12) United States Patent
    Greiner et al.

(10) Patent No.:    US 12,572,079 B2
(45) Date of Patent:       Mar. 10, 2026

(54) OPTICAL DEVICES AND METHODS FOR MANUFACTURING THE OPTICAL DEVICES

(71) Applicant: II-VI Delaware, Inc., Wilmington, DE (US)

(72) Inventors: Christoph M. Greiner, Eugene, OR (US); Dmitri Iazikov, Eugene, OR (US)

(73) Assignee: II-VI DELAWARE, INC., Wilmington, DE (US)

( * ) Notice:    Subject to any disclaimer, the term of this patent is extended or adjusted under 35 U.S.C. 154(b) by 596 days.

(21) Appl. No.: 18/054,315

(22) Filed:    Nov. 10, 2022

(65)             Prior Publication Data

US 2023/0152708 A1      May 18, 2023

Related U.S. Application Data

(60) Provisional application No. 63/264,141, filed on Nov. 16, 2021.

(51) Int. Cl.
    *G03F 7/00*        (2006.01)
    *G03F 7/004*       (2006.01)
    *G03F 7/095*       (2006.01)
    *G03F 7/20*        (2006.01)

(52) U.S. Cl.
    CPC ........ *G03F 7/70158* (2013.01); *G03F 7/0041* (2013.01); *G03F 7/095* (2013.01); *G03F 7/2002* (2013.01)

(58) Field of Classification Search
    CPC ... G02B 5/0278; G02B 5/1809; G02B 5/1871
    See application file for complete search history.

(56)             References Cited

U.S. PATENT DOCUMENTS

| | | | |
|---|---|---|---|
| 4,851,079 | A | 7/1989 | Booth et al. |
| 5,965,327 | A | 10/1999 | Kuboya et al. |
| 7,190,854 | B1 | 3/2007 | Novotny et al. |
| 9,618,664 | B2 | 4/2017 | Mossberg et al. |
| 10,386,553 | B2 | 8/2019 | Mossberg et al. |
| 10,539,723 | B2 | 1/2020 | Iazikov et al. |
| 10,823,889 | B2 | 11/2020 | Mossberg et al. |

(Continued)

FOREIGN PATENT DOCUMENTS

| | | |
|---|---|---|
| CN | 108121156 A | 6/2018 |
| EP | 1531346 A1 | 5/2005 |

OTHER PUBLICATIONS

"Extended European Search Report issued in European Application No. 2207338.9 Apr. 12, 2023".

*Primary Examiner* — Alexander P Gross
(74) *Attorney, Agent, or Firm* — Blank Rome LLP

(57)             ABSTRACT

An optical device is fabricated with a higher resolution of features in a patterned lattice. A photoresist is applied to a device layer for the optical device. Several photomasks offset from one another are used in different exposure steps to expose the photoresist with features. The features in each exposure can have different characteristic dimensions, such as different diameters for posts or holes to be produced in the device layer. Once the exposures are complete, the patterned lattice of the features are produced in the device layer. For example, the photoresist is developed, and reactive ion etching is used to produce the features in the device layer.

9 Claims, 8 Drawing Sheets

(56)     References Cited

U.S. PATENT DOCUMENTS

| 2015/0049318 A1* | 2/2015 | Hayashibe | ................ G03F 1/00 |
| | | | 430/5 |
| 2019/0088694 A1 | 3/2019 | Chiu et al. | |
| 2020/0271837 A1 | 8/2020 | Greiner et al. | |
| 2022/0004732 A1* | 1/2022 | Hsieh | ................... H10F 39/024 |

* cited by examiner

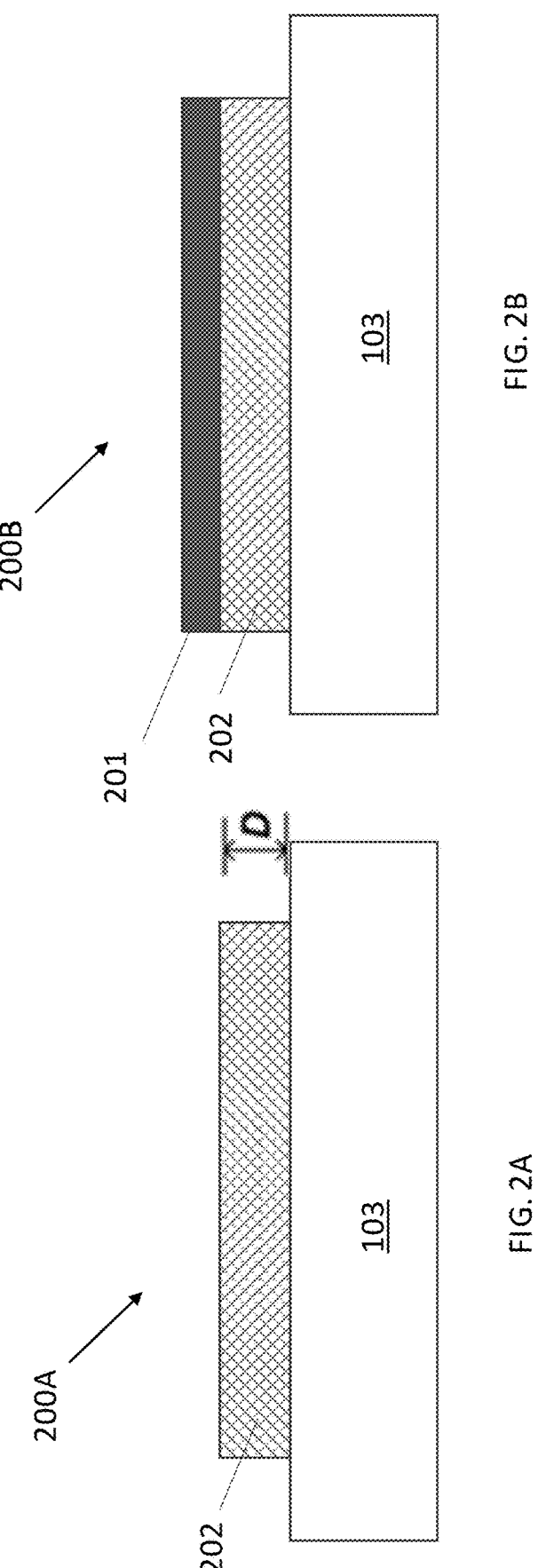

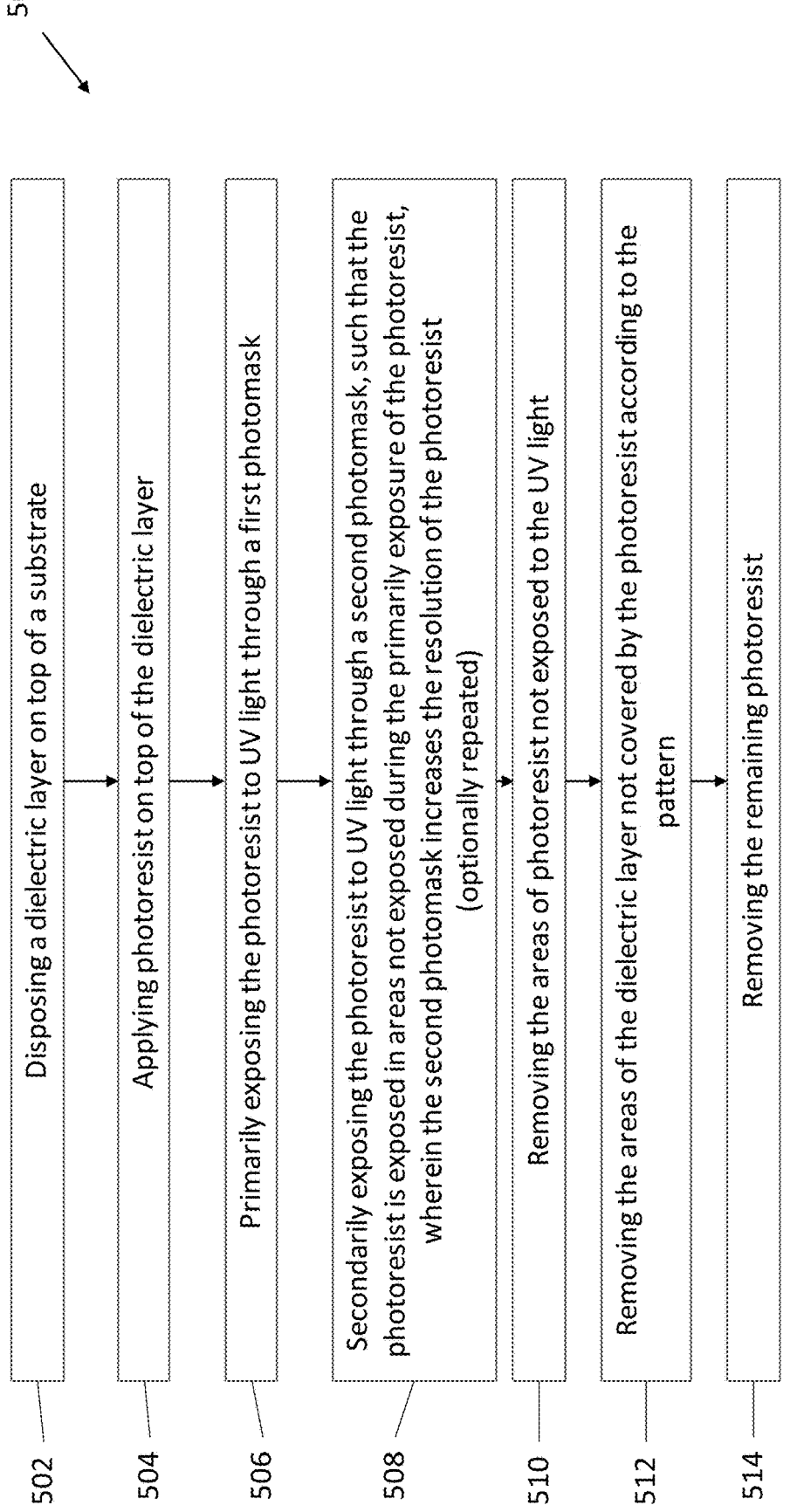

500

502 — Disposing a dielectric layer on top of a substrate

504 — Applying photoresist on top of the dielectric layer

506 — Primarily exposing the photoresist to UV light through a first photomask

508 — Secondarily exposing the photoresist to UV light through a second photomask, such that the photoresist is exposed in areas not exposed during the primarily exposure of the photoresist, wherein the second photomask increases the resolution of the photoresist (optionally repeated)

510 — Removing the areas of photoresist not exposed to the UV light

512 — Removing the areas of the dielectric layer not covered by the photoresist according to the pattern 514 — Removing the remaining photoresist

FIG. 5

OPTICAL DEVICES AND METHODS FOR MANUFACTURING THE OPTICAL DEVICES

CROSS-REFERENCE TO RELATED APPLICATIONS

This patent application claims the benefit of and priority to U.S. Prov. App. No. 63/264,141 filed Nov. 16, 2021, the entirety of which is incorporated herein by reference.

BACKGROUND OF THE DISCLOSURE

The resolution of designs on optical devices, i.e., the minimum size that the elements of a design can have, are limited by the fabrication technology used to produce the optical device. For example, when photolithography is used to apply designs to an optical device, there are limits on what minimum size can realistically be achieved for individual elements of the design, which impacts the design of the respective optical device.

The subject matter of the present disclosure is directed to overcoming, or at least reducing the effects of, one or more of the problems set forth above.

SUMMARY

The present disclosure is directed to methods for manufacturing optical devices. In one aspect of the disclosure, the methods include disposing a dielectric layer on top of a substrate. In another aspect of the disclosure, the methods may include applying photoresist on top of the dielectric layer. In one aspect of the disclosure, the methods may include primarily exposing the photoresist through a first photomask. Moreover, in one aspect of the disclosure the methods may include secondarily exposing the photoresist to UV light through a second photomask, such that the photoresist is exposed in areas not exposed during the primary exposure of the photoresist, where the second photomask increases the resolution of the photoresist. In one aspect of the disclosure, the methods may include removing the areas of photoresist not exposed. In yet another aspect of the disclosure, the methods may include removing the areas of the dielectric layer not covered by the photoresist according to the pattern. In yet another aspect of the disclosure, the methods may include removing the remaining photoresist.

In one aspect of the disclosure, the first and/or second photomask includes circles. In one aspect of the disclosure, the circles are arranged in a triangular, square, rectangular, or hexagonal lattice. In another aspect of the disclosure, the circles of the second photomask are smaller than the circles of the first photomask. Disclosed methods may include, for example: tertiary exposing the photoresist through a third photomask, such that the photoresist is exposed in areas not exposed during the primarily and secondary exposure of the photoresist, where the third photomask increases the resolution of the photoresist.

The present disclosure is also directed to optical devices manufactured in accordance with disclosed methods. In once aspect of the disclosure, the optical devices may include a substrate. In another aspect of the disclosure, disclosed optical devices may include a dielectric layer on top of a substrate. In yet another aspect of the disclosure, the dielectric layer may include features that are dimensioned such that light interacting with the dielectric layer experiences a phase delay according to a phase delay function.

In one aspect of the disclosure, each feature is a post, hole or trench. In another aspect of the disclosure, each feature is filled with air, vacuum, or a material with a refractive index differing from the refractive index of the substrate. In another aspect of the disclosure, the substrate is an optically transparent substrate, for example, glass or fused silica. In one aspect of the disclosure, the optical device is transmissive or reflective. In one aspect of the disclosure, each feature is smaller than the wavelength of light incident to, emerging from, and/or transmitted by that particular feature. In another aspect of the disclosure, each feature is a discrete, circumscribed non-recessed area surrounded by a recessed area of the dielectric layer. Yet in another aspect of the disclosure, each feature is a circumscribed post, column, pillar, or wall of the dielectric layer.

In another aspect of the disclosure, each feature includes a characteristic dimension, for example, a diameter and a height. The height and the diameter of each feature is dimensioned such that, when an optical wave, with a particular wavelength, travels through the optical device, the optical wave experiences a differential phase delay according to the phase delay function. Disclosed devices may further include: an optical medium that covers the dielectric layer. The optical medium has a different refractive index than the dielectric layer.

Disclosed herein are methods of fabricating an optical device. The methods of fabricating also include applying a resist layer to a device layer for the optical device; producing a set of first features in the resist layer using a first mask, the first features arranged in a period in a patterned grid and having one or more first characteristic dimensions; producing at least one set of additional features in the patterned grid in the resist layer using at least one additional mask offset at a fraction of the period in at least one planar dimension from the first features, the additional features having one or more additional characteristic dimensions; and producing the patterned grid of the first features and the additional features in the device layer.

In one aspect of the disclosure, a patterned grid may include a rectangular grid; where the at least one planar dimension may include first and second orthogonal dimensions; where the fraction of the period may include half of the period; and where producing the at least one set of the additional features in the patterned grid in the resist layer using the at least one additional mask offset at the fraction of the period in the at least one planar dimension from the first features may include: producing three sets of the additional features for the rectangular grid in the resist layer using three of the at least one additional mask, one of the three additional masks offset at half of the period in the first orthogonal dimension from the first features, another of the three additional masks offset at half of the period in the second orthogonal dimension from the first features, yet another of the three additional mask offset at half of the period in both the first and second orthogonal dimensions from the first features. The patterned grid may include a triangular grid; and where producing the at least one set of the additional features in the patterned grid in the resist layer using the at least one additional mask offset at the fraction of the period in the at least one planar dimension from the first features may include: producing three sets of the additional features for the triangular grid in the resist layer using three of the at least one additional mask, each of the three additional masks offset at the fraction of the period in one of three of the planar dimensions from the first features. The patterned grid may include a hexagonal grid; and where producing the at least one set of the additional features in the patterned grid in the resist layer using the at least one additional mask offset at the fraction of the period in the at least one planar dimension from the first features may include: producing five sets of the additional features for the rectangular grid in the resist layer using five of the at least one additional mask, each of the five additional masks being offset.

Disclosed herein are methods of fabricating an optical device. In one aspect of the disclosure, the methods may include applying a resist layer to a device layer for the optical device; producing a patterned grid of a set of first features in the resist layer using a first mask, the first features arranged in a period in the patterned grid and having one or more first characteristic dimensions; producing a set of second features for the patterned grid in the resist layer using a second mask offset at half of the period in a first planar dimension from the first features, the second features having one or more second characteristic dimensions; producing the patterned grid of the first and second features in the device layer.

Disclosed methods may include, in one aspect of the disclosure, producing a set of third features for the patterned grid in the resist layer using a third mask offset at half of the period in a second planar dimension from the first features, the third features having one or more third characteristic dimensions, where producing the patterned grid of the first and second features in the device layer further may include producing the pattered grid of the third features in the device layer. In one aspect of the disclosure, producing the patterned grid of the first, second, and third features in the device layer further may include producing the pattered grid of the fourth features in the device layer. In one aspect of the disclosure, the device layer is a substrate or is a dielectric layer disposed on the substrate. In one aspect of the disclosure, the resist layer is a photoresist layer. In one aspect of the disclosure, producing the patterned grid of the features in the device layer may include defining the patterned grid in the device layer using reactive ion etching. In one aspect of the disclosure, each of the one or more characteristic dimensions in a given set are the same as one another. In one aspect of the disclosure, each of the one or more characteristic dimensions in each set are different from one another. In one aspect of the disclosure, the patterned grid of the first features is a rectangular grid having the period of 500 nm center-to-center between adjacent ones of the first features in the first and second planar dimensions, where the first characteristic dimension ranges from 200 nm to 300 nm. In one aspect of the disclosure, the patterned grid of the features in the device layer is a rectangular grid having a period of 250 nm center-to-center between the adjacent ones of the respective features in the first and second planar dimensions, where the first, second, third, and fourth characteristic dimensions range from 200 nm to 300 nm. In one aspect of the disclosure, the method may include designing the optical device to impart a differential phase delay in a range 0 to $2\pi$ or multiple of $2\pi$ radians by selecting a thickness of the device layer and selecting a range of the first, second, third, and fourth characteristic dimensions for an electromagnetic wave propagating through the optical device.

In one aspect of the disclosure, a device for transforming an optical signal in an operational wavelength range incident thereto is disclosed. In one aspect of the disclosure, the device includes a transmissive layer that may include first and second optical media transparent over the operational wavelength range; the first and second optical media being arranged within the transmissive layer as a contiguous multitude of pixel features, where each pixel may include either the first optical medium or the second optical medium, but not both; the transmissive layer being configured to transform at least a portion of the optical signal incident thereto according to a specified effective phase transformation function that varies as a function of two-dimensional position coordinates x and y along a surface of the transmissive layer; the pixel features including: a set of first pixel features produced from resist exposed in a first exposure from a first mask, arranged in a period in a patterned grid, and having one or more first characteristic dimensions; and at least one set of additional features produced from the same resist exposed in at least one addition exposure from at least one additional mask, arranged in the patterned grid offset at a fraction of the period in at least one planar dimension from the first features, the additional features having one or more additional characteristic dimensions. One general aspect includes where the device is configured to transmit or reflect the transformed portion of the optical signal.

The foregoing summary is not intended to summarize each potential embodiment or every aspect of the present disclosure.

BRIEF DESCRIPTION OF THE DRAWINGS

FIG. 2A shows a cross-sectional view of an intermediate stage of an optical device, according to one or more embodiments.

FIG. 2B shows another intermediate stage of the optical device, according to one or more embodiments.

FIG. 5 shows a flowchart of method steps for manufacturing an optical device, according to one or more embodiments.

DETAILED DESCRIPTION OF THE DISCLOSURE

As disclosed herein, an optical device has features patterned therein, for example, located on a patterned grid (e.g., rectangular, triangular, or hexagonal grid) or other distributions, which may or may not be regular. The disclosed optical devices can be, for example, a meta lens, a phase plate, a phase delay diffractive optical element, an optical phase delay plate, or a phase-transforming optical element. For example, the optical device can be generally similar in their function to devices disclosed in U.S. Pat. Nos. 9,618, 664; 10,386,553; 10,539,723; and 10,823,889 and in US Pat. Pub. 2020/0271837, which are each incorporated herein by reference in their entireties. But as described below, will contain additional features and methods of formation.

Example optical devices disclosed can be transmissive or reflective. The optical devices include a transmissive layer having two different optical media having differing refractive indices arranged in discrete features, volumes, areal regions, or pixels disposed along the transmissive layer. These features are arranged in the transmissive layer such that an optical signal incident on the optical device will be transformed by its interaction with the features in the transmissive layer to obtain a desired phase function or other result.

For example, disclosed optical devices can include a substrate having a first optical media disposed therein or thereon. While the remainder of this disclosure will refer to this first optical media as a device layer or a dielectric layer, it should be noted that first optical media need not be a dielectric so long as it has the desired optical properties. The dielectric layer (e.g. the first optical media or device layer) disposed on or as part of the substrate has a certain refractive index. The features are etched into or etched from the dielectric layer, and those features that were etched are filled with air, vacuum, or a material of different refractive index as the dielectric layer which will function as a second optical media. Each feature (which may also be referred to herein as a "pixel feature" or "feature" may thus be formed from the first optical media or the second optical media depending on whether the pixel is formed of what remains of the dielectric layer after etching (e.g., a "post" or "pillar") or is formed of the second optical media (e.g. a "hole"). And together, the region/layer where both posts and hole reside is the transmissive layer. To avoid confusion, the first optical medium, e.g., the dielectric layer, will be referred to as a dielectric layer, and the second optical medium (e.g. that which fills in between etched or removed dielectric layer) will be referred to as the optical medium. Each feature has a certain dimension (e.g., a diameter of a post or a hole). Alteration of the dimension of a feature changes the phase delay/phase function experienced by an electromagnetic or light wave propagating through the respective feature.

Figure 1:
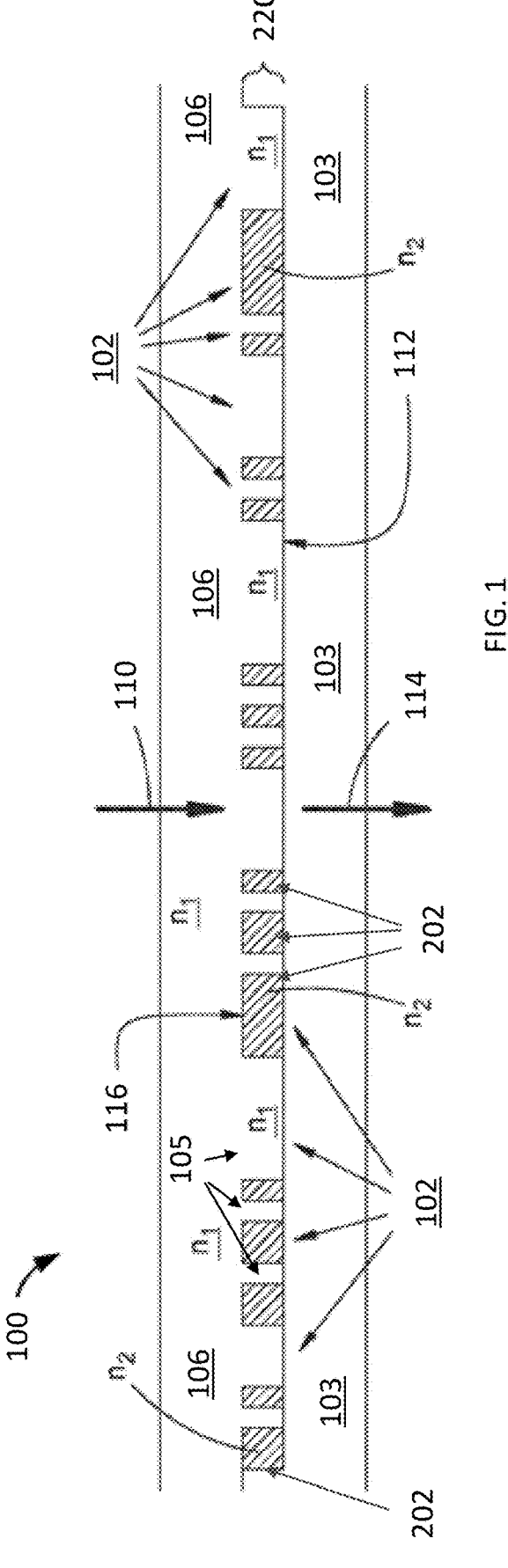
FIG. 1 shows a schematic cross-section of an optical device, according to the present disclosure.

FIG. 1 shows a schematic cross-section of an example optical device 100 according to the present disclosure. The example optical device 100 is shown as being transmissive, which means light generally passes through the optical device 100. The optical device 100 may include a substrate 103 and transmissive layer 220 that includes features 102 formed of dielectric layer 202 and/or an optical medium 106. The dielectric layer 202 in example optical device 100 has a refractive index $n_2$, and the optical medium 106 has a refractive index $n_1$ different from the refractive index $n_2$ of the dielectric layer 202. The optical medium 106 can be solid, liquid, or gaseous, such as air or vacuum. The substrate 103 can be a solid material differing from the optical medium 106.

In one arrangement, the dielectric layer 202 has a substantially uniform thickness, has a multitude of suitably sized and positioned perforations or holes 105, and is immersed in the ambient optical medium 106 that surrounds the dielectric layer 202 and fills the holes 105. The holes (also referred to as recesses herein) 105 and the intervening areas of the dielectric layer 202 form a plurality of features 102 that together form the transmissive layer 220 having the same substantially uniform thickness as the dielectric layer 202.

The optical device 100 is structurally arranged so as to receive an optical signal 110 incident on the first surface 116 of the transmissive layer 220 and to transmit at least a portion of the incident optical signal 110 from a second surface 112 of the transmissive layer 220 as a transmitted optical signal 114 transformed according to the effective phase transformation function defined by the characteristic size and position of the features 102.

The features 102 for the optical device 100 can be arranged in any suitable lattice pattern, e.g., triangular, square, rectangular, or hexagonal, or irregular patter. In one example, the features 102 are arranged in a lattice pattern having subwavelength (relative to the incident light 110) features 102, such that there may be little or no unwanted coherent scattering or diffraction from the transmissive layer 220. Alternatively, the features 102 and/or the lattice may be larger than the wavelength if a different outcome is desired.

FIG. 5 shows a flowchart of an example method 500 for manufacturing disclosed optical devices, for example, optical device 100, and will be discussed with reference to FIGS. 2A through 4B. Disclosed methods improve upon the limits of traditional photolithographic resolution. Example disclosed methods increase the resolution by exposing the same photoresist using multiple photomasks and exposures prior to development, as described below.

At step 502, a dielectric layer is disposed on top of a substrate. FIG. 2A shows a cross-sectional view of an example intermediate optical device 200A of an example optical device 100 (FIG. 1). The intermediate optical device 200A includes a dielectric layer 202 disposed on top of a substrate 103 in accordance, for example, with step 502. In some examples, the substrate 103 is an optically transparent substrate 103, which can be, for example, glass or fused silica.

The dielectric layer 202 is, for example, etchable, has a certain refractive index $n_2$, and a height D, which may be the same or about the same height as the resulting transmissive layer 220. In this example, the dielectric layer 202 is formed of an optical media, through which light may also propagate. The optical media has discrete features, volumes, and areas. In some embodiments, the dielectric layer 202 is made of the same material as the substrate 103 or is part of the substrate 103.

At step 504 of method 500 (FIG. 5), photoresist is applied on top of the dielectric layer. FIG. 2B shows the intermediate optical device 200B, which is the same or similar to the intermediate optical device 200A of FIG. 2A with photoresist 201 applied on top of the dielectric layer 202, in accordance with step 504 of method 500.

As will be discussed further below, at steps 506 and 508, the photoresist 201 will be exposed two or more times through successive different photomasks to overlap multiple patterns without interceding development. As will be shown, such successive exposures will increase the potential resolution of exposed regions (and ultimately features 102) allowing such features 102 to be formed with photolithography where other fabrication techniques, such as an electron beam resist exposure process, may be too slow or costly to be practical for use in producing a desired optical device.

At step 506, the photoresist is primarily exposed through a first photomask. The methods of exposing (e.g., hardening) a photoresist will vary depending on the type of photoresist chosen for a particular application. However, in one example, the photoresist may be exposed through application of ultraviolet (UV) light. The photoresist is exposed to UV light through a first photomask. The photomask shields the UV light from certain areas of the photoresist causing those masked areas not to react to the UV light. By exposure to the UV light (in areas not masked), the photoresist is made non-dissolvable if using a negative resist. While the remaining disclosure will make reference to the use of a negative photo resist, which is shown forming pillars (or non-recessed regions), other embodiments may use a positive photoresist (in which exposure to UV light makes such photoresist dissolvable) to form holes (or recessed regions).

Figures 3A, 3B, 3C, 3D:
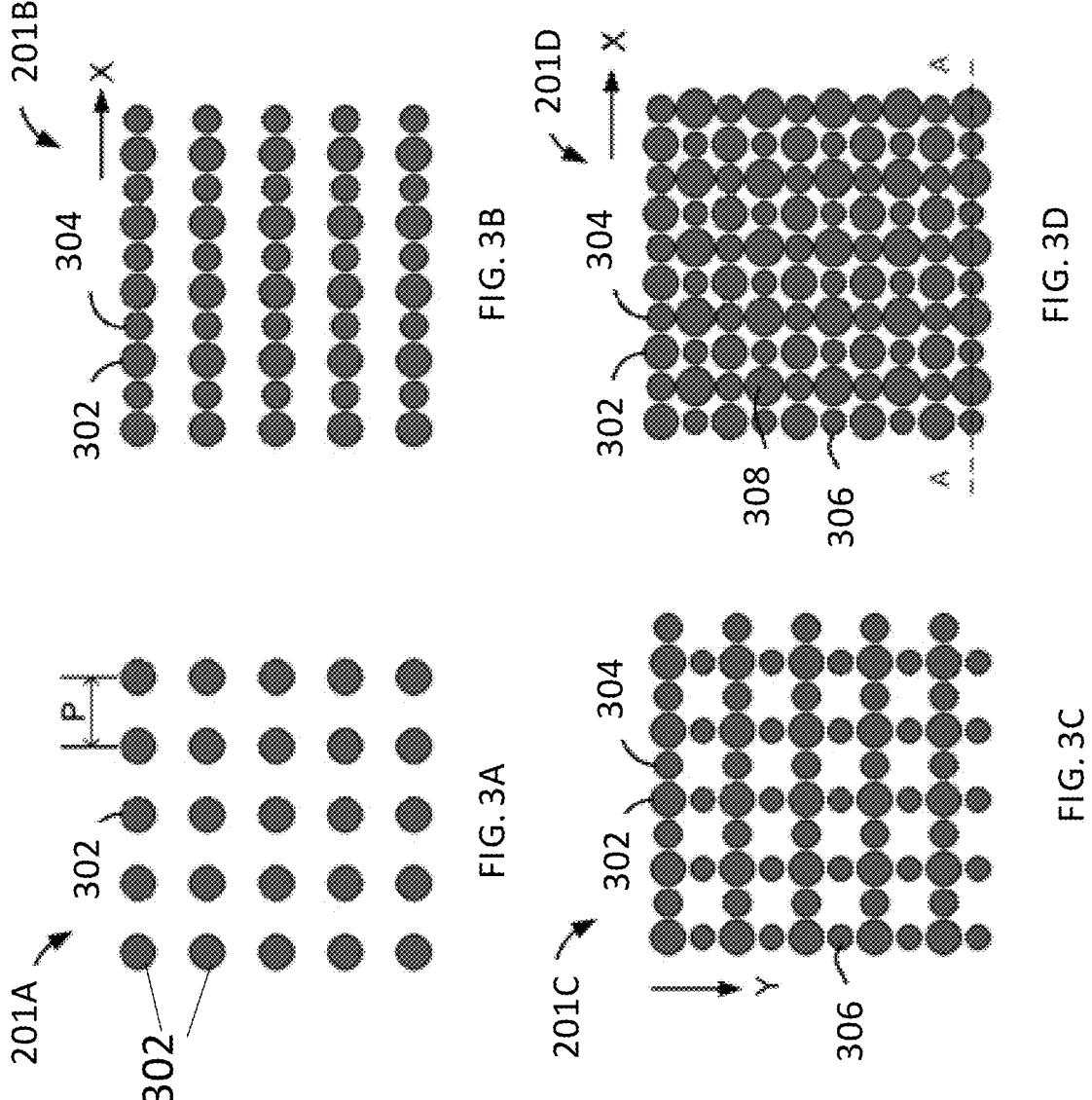
FIG. 3A shows a schematic top view of a patterned photoresist, according to one or more embodiments.
FIG. 3B shows a schematic top view of a photoresist with a second pattern, according to one or more embodiments.
FIG. 3C shows a schematic top view of a photoresist with a third pattern, according to one or more embodiments.
FIG. 3D shows a schematic top view of a photoresist with a fourth pattern, according to one or more embodiments.

FIG. 3A shows a schematic top view of the photoresist 201 (FIG. 2B) with an example first pattern 201A. The first pattern 201A, as shown, includes first circles 302 representing example areas of exposure. The surrounding negative spaces (between first circles 302) represent areas not yet exposed during the first or primary exposure. The first circles 302 have a distance P to the neighboring first circles 302. In other words, the first circles 302 are arranged in a rectangular lattice with a center-to-center distance P. The first circles 302 define the lattice points. The lattice is defined by a x-direction and a y-direction, wherein the x- and y-direction are orthogonal to each other. However, it will be appreciated that other lattices can be used, such as a hexagonal lattice.

While first pattern 201A shows only circles for individual elements, other geometries may also be used, for example, ovals, rectangles, diamonds, or other combinations of curved and linear sided shapes.

In some embodiments, the first circles 302 have characteristic dimensions, e.g., diameters, ranging from 200 to 300 nm. The first circles 302 may be disposed on a rectangular or square lattice with a side length between lattice points ranging from 400 to 500 nm. As will be discussed below, this example optical device can form a unit cell and be combined with other unit cells. The smaller the distance between the lattice points, the higher effective resolution of the light passing through the optical device.

At step 508, the photoresist is secondarily exposed (through one or more additional exposures through repetition of step 508) to UV light through a second (or follow-on) photomask(s), such that the photoresist is exposed in areas not exposed during the primary exposure of the photoresist, wherein the second photomask increases the resolution of the photoresist. FIGS. 3B-3F show some example patterns of photoresist after the photoresist is exposed to UV light through additional successive photomasks.

FIG. 3B shows a schematic top view of the photoresist with a second pattern 201B resulting from a second light exposure. The pattern 201B is produced by a second photomask (not shown in FIG. 3B) layered over previously exposed pattern 201A. The second light exposure created second circles 304 that are, for example, smaller in diameter than the first circles 302. The second circles 304 are offset and disposed in between the first circles 302 at, for example, half the period distance P in the x-direction only. Therefore, if the lattice period P were 500 nm, then the second circles 304 would be offset 250 nm in a single linear dimension x, as shown.

FIG. 3C shows a schematic top view of the photoresist with a third pattern 201C resulting from a third light exposure (through repetition of step 508). The pattern 201C is created with a third photomask (not shown in FIG. 3C) layered over previously exposed patterns 201A, 201B. The pattern 201C, may include, for example third circles 306 in addition to the first and second circles 302, 304. The third circles 306 are disposed between the first circles 302 in the y-direction at half the distance P. The third circles 306 are shown having the same diameter as the second circles 304, but they need not be.

FIG. 3D shows a schematic top view of the photoresist with a fourth pattern 201D resulting from a fourth light exposure (through repetition of step 508). The fourth pattern 201D is created with a fourth photomask (not shown in FIG. 3D) layered over previously exposed patterns 201A, 201B, 201C. The fourth pattern 201D may include, for example, fourth circles 308 in addition to the first, second, and third circles 302, 304, 306. The fourth circles 308 may have, for example, the same diameter as the first circles 302 or they may be different. The fourth circles 308 are disposed between the second and third circles 304, 306 at half the distance P in x- and y-direction. Thus, the resultant optical device of FIG. 2D would have features 102 of different characteristic dimensions on a resulting 250 nm grid assuming a P of 500 nm (250×250 nm features). The Line A-A in FIG. 3D shows an example cross-sectional plane representing the views of FIGS. 1A-1B, although the example optical device 100 may have differing patterns. As shown, through multiple successive exposures through different photomasks, a higher resolution pattern (e.g., 201D) can be obtained compared to, for example, pattern 201A.

Figure 3F:
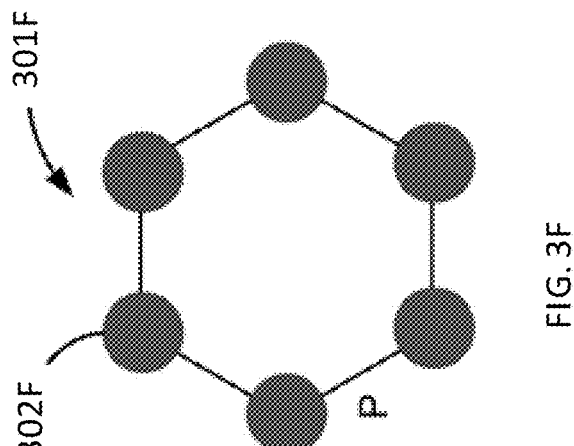
FIG. 3F shows a schematic top view of the photoresist with a sixth pattern.

Each of the first, second, third, and fourth circles 302, 304, 306, 308 may have different diameters and offset distances from one another to create a desirable phase delay or optical transformation. Other patterns of the photoresist are possible, for example alternative patterns are shown in FIGS. 3E and 3F and described below.

Figure 3E:
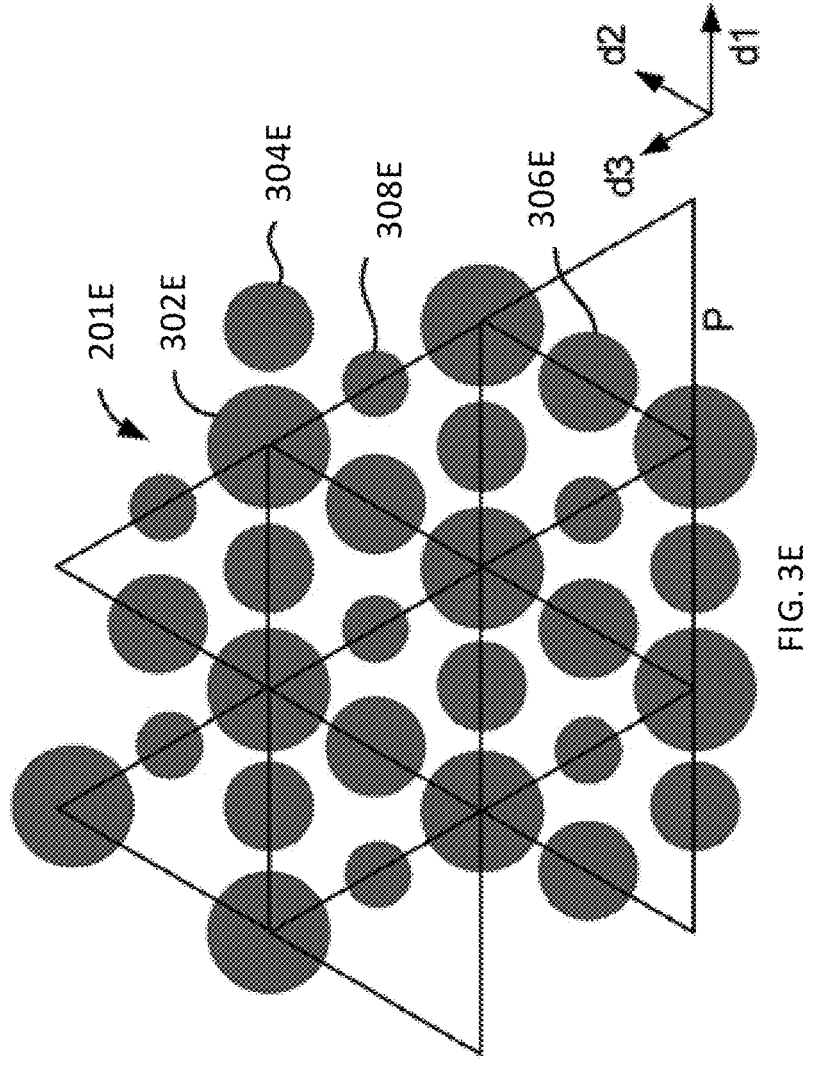
FIG. 3E shows a schematic top view of the photoresist with a fifth pattern.

FIG. 3E shows a schematic top view of the exposed photoresist with an alternative (fifth) pattern 201E. The pattern 201E resulted from multiple photomasks arranged in planar dimensions having offsets along axis d1, d2, d3 at half the periods of the lattice points within circles 302E. The lattice of the pattern 201E has a triangular unit cell with circles 302E at each lattice point, and circles 304E, 306E, and 308E therebetween. Each lattice point has a distance P to the neighboring lattice points, i.e., the period between circles 302E.

The pattern may be formed using successive photomasks in a similar process as that described with reference to FIGS. 3A-3D. For example, a first photomask (and exposure) may be used to create the first circles 302E at each of the lattice points of the pattern 201E representing the exposed regions of the photoresist. A second photomask and exposure may then be used to create the second circles 304E offset a fraction of distance P. The second circles 304E of FIG. 3E are disposed between the first circles 302E along the axis d1 at half the distance P.

A third photomask and exposure may then be used to create the third circles 306E of the photoresist 201E. The third circles 306E are disposed between the first circles 302E along the axis d2 at half the distance P. A fourth photomask and exposure may then be used to create fourth circles 308E of the photoresist 201E. The fourth circles 308E are disposed between the first circles 302E along the axis d3 at half the distance P.

Each of the first, second, third, and fourth circles 302E, 304E, 306E, 308E are shown having varying diameters. However, the diameters of the first, second, third, and fourth circles 302E, 304E, 306E, 308E may also be the same depending on the desired configuration of the resultant optical device. In some embodiments, photomasks of different sizes are used to create bigger or smaller circles than the circles shown in FIG. 3E or alternatively with different spacing between pattern circles. Further, the pattern need not be comprised solely of circular shapes.

FIG. 3F shows a schematic top view of the photoresist with a sixth example pattern 301F.

The sixth pattern 301F is created using a photomask (and exposure) with a hexagonal pattern to create circles 302F with a distance P from each circle 302F to the neighboring circle 302F. Additional photomasks can be used to create second circles at, for example, half the distance P. The circles 302F are shown, for example, having equal diameters. The circles 302F can be arranged in a lattice with any suitable pattern, e.g., triangular, square, rectangular, or hexagonal.

Upon completion of the exposures at step 506 of method 500 (FIG. 5) and subsequent secondary exposure(s) at step 508 to form the desired pattern of exposed photoresist, the photoresist on the intermediate optical device that has not been exposed, e.g. not exposed to UV light (represented by the negative space between the circles of FIGS. 3A through 3F) are removed at step 510 through the use of an appropriate developer and process, e.g., spray development, dipping baths, etc.) selected for the chosen photoresist which will remove the unexposed photoresist, but not the exposed photoresist.

After the photoresist has a final pattern following development at step 510, at step 512 of method 500, the dielectric layer 202 is removed in areas where the photoresist is not present according to the final pattern of the photoresist (e.g., the negative of patterns discussed with reference to FIGS. 3A through 3F). In other words, the dielectric layer 202 is removed in areas not covered by photoresist. The patterned photoresist is used as an etch-mask to etch the dielectric layer for producing features 102 (FIG. 1). In some embodiments, the dielectric layer 202 is removed by reactive ion etching (RIE), however other etching processes compatible with the chosen photoresist may also be utilized. RIE is a type of dry etching. RIE uses chemically reactive plasma to remove the dielectric layer 202. The plasma is generated under low pressure or vacuum by an electromagnetic field. High-energy ions from the plasma attack the dielectric layer 202 and react with the dielectric layer 202 not covered with activated or exposed photoresist.

Figure 4B:
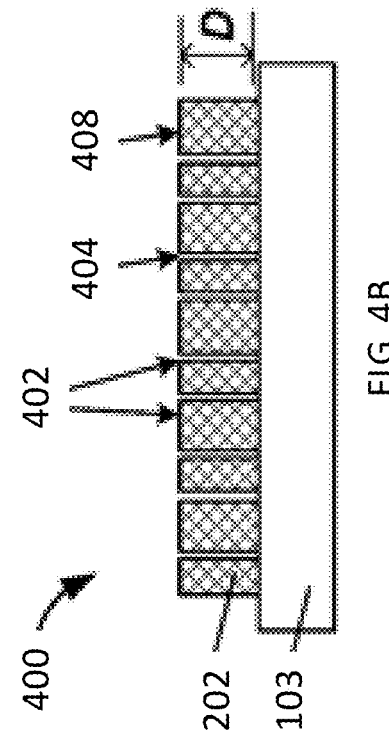
FIG. 4B shows a cross-sectional view of an optical device, according to one or more embodiments.
Figure 4A:
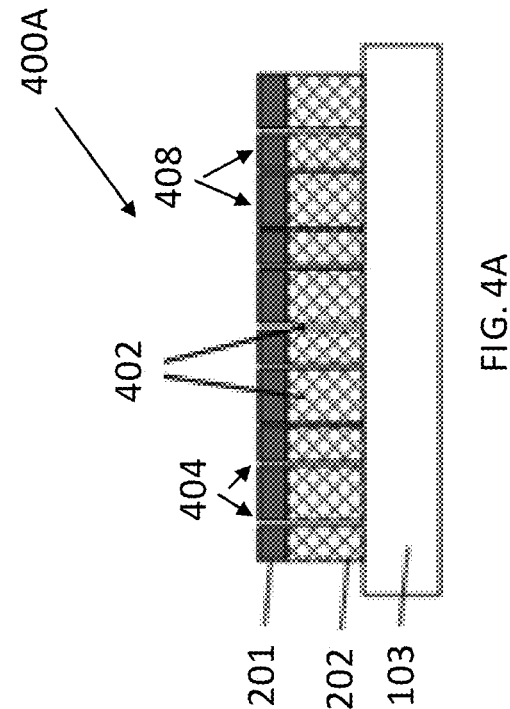
FIG. 4A shows a cross-sectional view of an intermediate stage of the optical device, according to one or more embodiments.

FIG. 4A shows a cross-sectional view of intermediate optical device 400A, which is the same or similar to the intermediate optical device 200B of FIG. 2B, after steps 506, 508, 510, and 512 have been completed, in which areas of the dielectric layer 202 not covered by the patterned photoresist 201 have been removed, for example via etching, according to step 512. The pattern of the dielectric layer 202 is resultant from the pattern of the photoresist 201.

After the dielectric layer 202 is removed, e.g. etched, the dielectric layer 202 includes recessed areas 404, that correspond to holes 105 (FIG. 1), and non-recessed areas 408, that will correspond to the dielectric layer 202 of FIG. 1.

At step 514 of method 500, the remaining photoresist 201 may be removed from dielectric layer 202. The photoresist 201 can be removed, for example, by a suitable means for the chosen photoresist. For example, chemical removal, mechanical removal, a liquid resist stripper, by oxygen containing plasma by oxidizing the photoresist (ashing), or any other suitable removal method. A resist stripper chemically alters previously exposed photoresist such that the photoresist no longer adheres to the dielectric layer 202. Another method for removing the photoresist is using 1-Methyl-2-pyrrolidone (NMP) solvent. Following removal of the remaining photoresist 201, the resulting optical device 400 (FIG. 4B) may be used as is with the ambient atmosphere filling in the recessed areas 404 or an alternative optical media 106 may be added to optical device 400. Optical device 400, shown as a cross-sectional view is an example of another optical device 100 (FIG. 1F).

As stated previously with respect to optical device 100, the optical device 400 can be transmissive or reflective. An example reflective optical device may include a reflector (not shown) to reflect an incident optical signal transmitted through the transmissive layer. The optical device 400 can be, for example, one or more of a lens, a meta lens, a phase delay diffractive optical element, or phase-transforming optical element. In should be noted that descriptions of optical device 400 are equally applicable to optical device 100.

With reference to FIG. 4B, the recessed areas 404 and the non-recessed areas 408 are each considered features 402, similar or equivalent to features 102 of FIG. 1. Each feature 402 has a circular shaped cross section if formed with any of the patterns discussed with respect to FIGS. 3A-3F. Furthermore, each feature 402 has a diameter, or characteristic dimension, suited for a particular wavelength of an optical signal to be propagated through the particular feature 402. The features 402 may be subwavelength in size, which means the features are smaller than the wavelength of light incident to, emerging from, and/or transmitted by the feature 402. The features 402 may also be larger than the wavelength of the light incident to, emerging from, and/or transmitted by the features. The features 402, either alone or in conjunction with neighboring features 402 generate a specific phase delay or transformation to the light that is propagated through that particular feature 402.

Any particular feature 402 includes either the dielectric material 202 having refractive index $n_2$, or the optical medium 106 (FIG. 1) having a refractive index $n_1$. However, in the examples shown, a feature 402 does not include both (excluding portions of optical medium 106 above the transmissive layer 220 (FIG. 1).

In some embodiments, a feature 402 is a discrete, circumscribed non-recessed area 408 surrounded by a recessed area 404. In other embodiments, a feature 402 is a circumscribed post, column, pillar, or wall surrounded by a recessed area 404. Yet in other embodiments, a feature 402 is a discrete, circumscribed recessed areas 404 surrounded by a non-recessed area 408. A non-recessed area 408 may be a circumscribed hole, elongated region, or other shape surrounded by a recessed area 404. In should be noted that a single embodiment of an optical device 400 may contain features 402 that are non-recessed areas 408 and other features 402 that are recessed areas 404.

In some embodiments, the recessed areas 404 are filled with air, vacuum, or a material with a refractive index differing from the refractive index of the non-recessed areas 408, e.g., of dielectric 202 layer. Alteration of the dimension of the features 402 changes the phase delay/phase function experienced by an electromagnetic or light wave propagating through the respective features 402.

In one example, the height D of the dielectric layer 202 and the diameters of the features 402 are dimensioned such that, when an optical wave, with a particular wavelength, travels through the optical device 400, the optical wave experiences a differential phase delay in a range 0 to $2\pi$. In other words, the features, regions of features, and/or unit cells including features are sized and distributed to achieve a desired phase delay function as a set of features. Each etched pixel feature has a certain characteristic dimension (e.g., a diameter of a post or a hole). Alteration of the characteristic dimension changes the phase delay experienced by an electromagnetic wave propagating through the respective pixel feature. The thickness of the dielectric layer and the range of sizes for the pixel features may be selected to impart differential phase delay in the range 0 to $2\pi$ or in multiples of $2\pi$ radians. Thus, the arrangement of the disclosed pixel features can be considered as representing a phase delay function as a set of pixels, each having a substantially constant phase delay.

Due to the periodicity, any phase delay function can be replaced with an equivalent modulo $2\pi$ function. Therefore, each value of the phase delay function can be replaced by the corresponding value from 0 to $2\pi$ that differs from the original value by an integer multiple of $2\pi$ A phase delay function and its modulo $2\pi$ equivalent produce the same delay on an optical signal. In addition, phase delay functions that differ from one another at any given point by an integer multiple of $2\pi$ (and not necessarily the same multiple of $2\pi$ at each point) can be regarded as being equal to one another.

In some embodiments, the features 402 are sized and positioned irregularly, randomly, or pseudo-randomly. In other embodiments, the features 402 are arranged in a regular two-dimensional transverse lattice pattern across the optical device 400. In some embodiments, the features 402 can be arranged in a two-dimensional spatial pattern.

The pattern of the features can be analogous to "digitizing" the phase delay function so there can only be certain discrete values determined by the spacing of the features. However, spatial averaging arising from the wave nature of an input optical signal tends to "smooth out" the "digitized" approximation and imparts a substantially continuous phase delay function or an operationally acceptable approximation thereof. An example optical device 400 can delay a light wave such that the phase of the light wave changes.

Figures 6A, 6B:
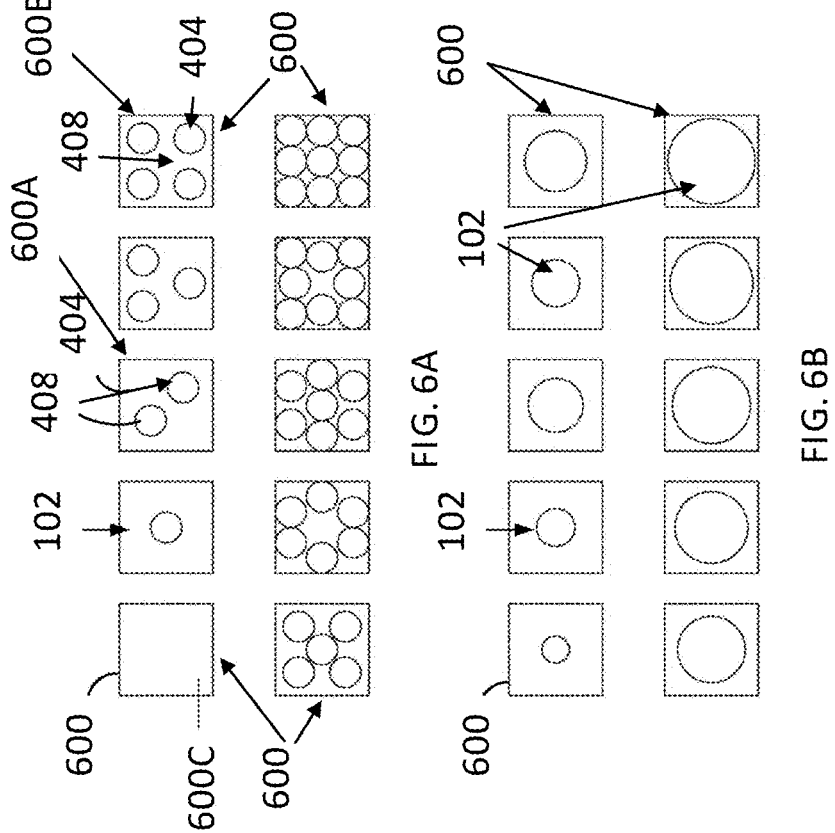
FIG. 6A shows schematic top views of unit cells of optical devices.
FIG. 6B shows schematic top views of other unit cells of optical devices.

The pixel features 102 can likewise be arranged in several types of unit cells 600 of an optical device 100, 400. For example, FIG. 6A schematically illustrates several examples of unit cells 600 having none, one, or multiple circumscribed pixel features 102 (i.e., areal regions of posts or holes) for use in a transmissive layer of the disclosed optical device.

In other examples, each one of the pixel features 102 is arranged so that, within each unit cell 600, a single simply connected volume of the first optical medium is surrounded by the second optical medium, or vice versa. For example, FIG. 6B schematically illustrates several examples of unit cells 600 having only a single circumscribed pixel feature 102 (i.e., areal region of post or hole) of varying sizes.

Figures 7A, 7B:
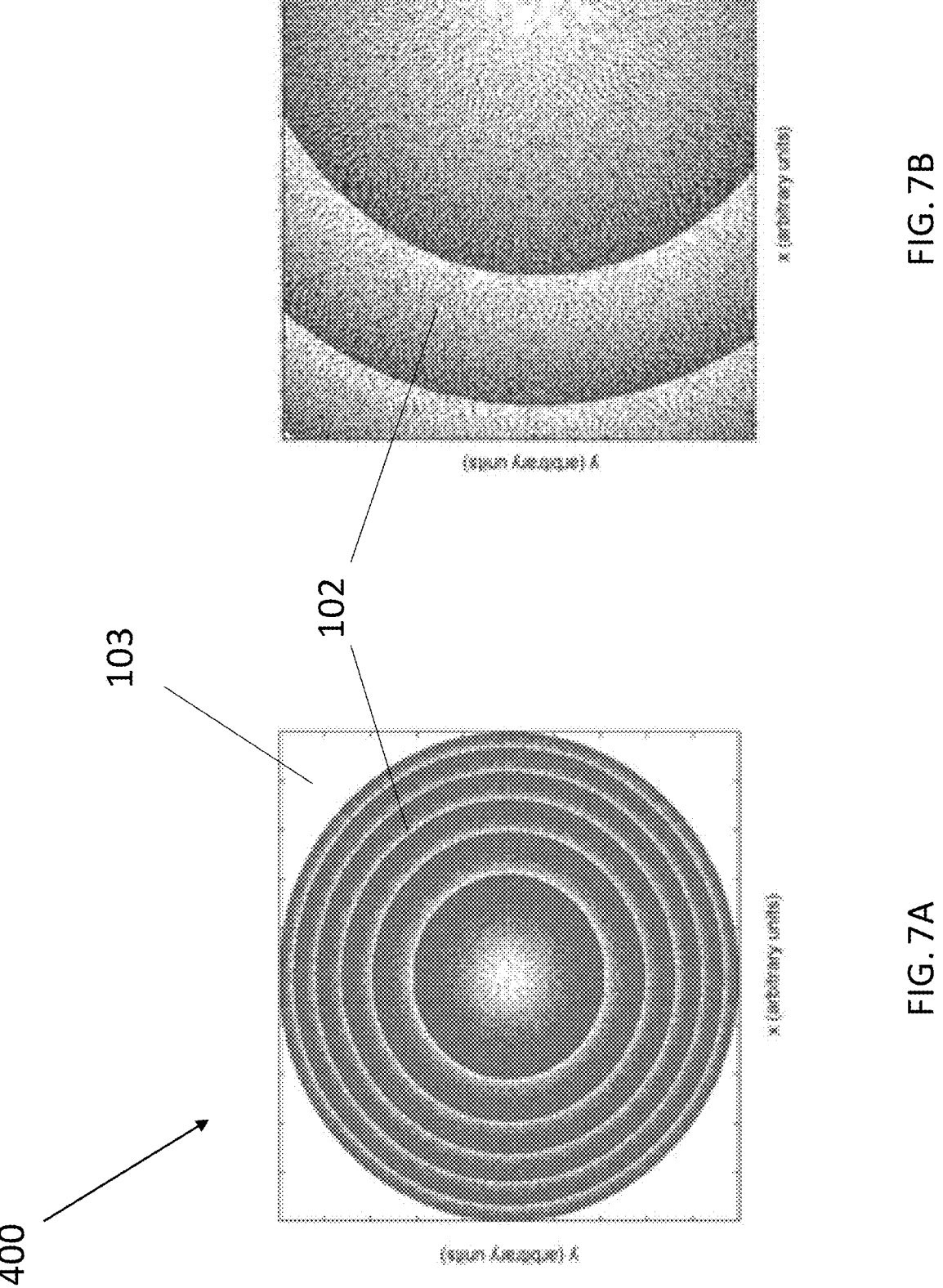
FIG. 7A shows a top view of an optical device with features distributed in an optical device according to one or more embodiments.
FIG. 7B shows a magnification of a part of FIG. 7A.

Accordingly, each unit cell 600 of a non-empty subset of the grid pattern can have pixel features 102 arranged as one or more discrete, circumscribed non-recessed areal regions 408 surrounded by a recessed areal region 404 (i.e., circumscribed posts, columns, pillars, or walls surrounded by recessed areas) shown within unit cell 600A of unit cells 600. Alternatively, each unit cell 600 of a non-empty subset of the grid pattern can have pixel features 102 arranged as one or more discrete, circumscribed recessed areal regions 404 surrounded by a non-recessed areal region 408 (i.e., circumscribed holes or trenches surrounded by non-recessed areas) shown, for example within unit cell 600B of unit cells 600. Any given grid-based example can contain at least a subset of unit cells 600 of the post type (e.g. non-recessed areas 408) or at least a subset of unit cells 600 of the hole type (e.g. recessed areas 404); in some examples both types can be present. In addition to post-type or hole-type unit cells 600 (or both), some grid-based examples can also include a subset of unit cells 600 that are entirely recessed, a subset of unit cells 600 that are entirely non-recessed, or both. An example of such a cell 600 is shown as cell 600C (although this view does not show whether the cell 600C is entirely recessed or non-recessed). The pixel features 102 and or unit cells 600 can be arranged in two-dimensional spatial patterns to approximate a desired phase function. FIGS. 7A-7B schematically illustrate a density distribution of pixel features 102 of a transmission layer 220 arranged to function as a lens. The higher-index layer (light shading in the figures) is produced in a pattern according to procedures disclosed herein. The resulting etched regions (dark shading in the figures) have a lower index. The arrangement produces an approximated modulo $2\pi$ quadratic phase function, which causes the resulting optical device 400 to act as a positive lens.

The foregoing description of preferred and other embodiments is not intended to limit or restrict the scope or applicability of the inventive concepts conceived of by the Applicants. It will be appreciated with the benefit of the present disclosure that features described above in accordance with any embodiment or aspect of the disclosed subject matter can be utilized, either alone or in combination, with any other described feature, in any other embodiment or aspect of the disclosed subject matter.

What is claimed is:

1. A method of fabricating an optical device, the method comprising:
   applying a resist layer to a device layer for the optical device;
   producing a set of first features in the resist layer using a first mask, the first features arranged in a period in a patterned grid and having one or more first characteristic dimensions;
   producing at least one set of additional features in the patterned grid in the resist layer using at least one additional mask offset at a fraction of the period in at least one planar dimension from the first features, the additional features having one or more additional characteristic dimensions; and
   producing the patterned grid of the first features and the additional features in the device layer,
   wherein the patterned grid comprises a triangular grid; and wherein producing the at least one set of the additional features in the patterned grid in the resist layer using the at least one additional mask offset at the fraction of the period in the at least one planar dimension from the first features comprises:
   producing three sets of the additional features for the triangular grid in the resist layer using three of the at least one additional mask, each of the three additional masks offset at the fraction of the period in one of three of the planar dimensions from the first features.

2. The method of claim 1, wherein the device layer is a substrate or is a dielectric layer disposed on a substrate.

3. The method of claim 1, wherein the resist layer is a photoresist layer.

4. The method of claim 1, wherein producing the patterned grid of the features in the device layer comprises defining the patterned grid in the device layer using reactive ion etching.

5. The method of claim 1, wherein each of the one or more first characteristic dimensions in a given set are the same as one another.

6. The method of claim 1, wherein each of the one or more first characteristic dimensions in each set are different from one another.

7. The method of claim 1, further comprising designing the optical device to impart a differential phase delay in a range 0 to $2\pi$ or multiple of $2\pi$ radians by selecting a thickness of the device layer and selecting a range of the one or more first characteristic dimensions and a range of the one or more additional characteristic dimensions for an electromagnetic wave propagating through the optical device.

8. The method of claim 1, further comprising:

disposing a dielectric layer on top of a substrate;

applying the resist layer on top of the dielectric layer;

primarily exposing the resist layer through the first mask;

secondarily exposing the resist layer through the at least one additional mask, such that the resist is exposed in areas not exposed during the primarily exposure of the resist layer, wherein the second mask increases a resolution of exposed areas of the resist layer;

removing areas of the resist layer not exposed;

removing areas of the dielectric layer not covered by the resist layer; and removing the remaining resist layer.

9. The method of claim 8, further comprising: tertiary exposing the resist layer through a third photomask, such that the resist layer is exposed in areas not exposed during the primarily and secondarily exposure of the resist layer, wherein the third photomask increases the resolution of the exposed areas of the resist layer.

\* \* \* \* \*